(12) United States Patent
Shih

(10) Patent No.: US 7,092,245 B2
(45) Date of Patent: Aug. 15, 2006

(54) CIRCUIT BOARD GROUP FOR ELECTRICALLY COUPLING ELECTRONIC DEVICES

(75) Inventor: Shoei-Yuan Shih, Taipei Hsien (TW)

(73) Assignee: Evserv Tech Corporation, Shijr (TW)

( * ) Notice: Subject to any disclaimer, the term of this patent is extended or adjusted under 35 U.S.C. 154(b) by 0 days.

(21) Appl. No.: 10/892,172

(22) Filed: Jul. 16, 2004

(65) Prior Publication Data
US 2006/0012964 A1    Jan. 19, 2006

(51) Int. Cl.
*H05K 5/20* (2006.01)
(52) U.S. Cl. ............... 361/679; 361/740; 439/152; 174/260
(58) Field of Classification Search .......... 361/695, 361/761, 679–687, 724–727, 740; 312/223.1–223.6; 439/60, 152–153; 174/255, 260
See application file for complete search history.

(56) References Cited

U.S. PATENT DOCUMENTS 5,684,674 A * 11/1997 Yin ....................... 361/695
6,459,593 B1 * 10/2002 Kwong ................. 361/761
6,816,368 B1 * 11/2004 Yokosawa .............. 361/685
2003/0112596 A1    6/2003 Shih
2003/0147210 A1    8/2003 Shih

* cited by examiner

Primary Examiner—Hung Van Duong
(74) Attorney, Agent, or Firm—Birch, Stewart, Kolasch & Birch, LLP

(57) ABSTRACT

The present invention discloses a circuit board group for electrically coupling electronic devices, which comprises a primary circuit board divided into an electronic device connecting section and a circuit section. The electronic device connecting section comprises a first connection port for connecting electronic devices and the circuit section comprises a second connection port. The primary circuit board is electrically connected to a secondary circuit board. A third connection port correspondingly coupled to the second connection port is disposed on the secondary circuit board at a position corresponding to the circuit section, and a through hole disposed on the secondary circuit board at a position corresponding to the electronic device connecting section for receiving the first connection port. Further, a fourth connection port is disposed on the other side of the secondary circuit board for increasing the number of installable electronic devices.

5 Claims, 5 Drawing Sheets

CIRCUIT BOARD GROUP FOR ELECTRICALLY COUPLING ELECTRONIC DEVICES

FIELD OF THE INVENTION

The present invention relates to a circuit board group constituting an electrical connection for an electronic device, more particularly to an electronic device array or a server that can be used in a disk array or a power supply array to increase the number of installable electronic devices by means of a circuit board group capable of installing a primary circuit board and a secondary circuit board and either circuit board can be installed in the same space.

BACKGROUND OF THE INVENTION

To overcome the existing limitation on the specification of servers, the present related industry spares no efforts to reduce the area of installing each of the required components of the server, and greatly increases the number of installable disk drives, and thus maximizing the performance of the server.

The inventor of the present invention also filed an application and was granted with the U.S. Patent Publication NO. 2003-0112596A1 entitled "Server with four hard disk drives". The invention disclosed an 1U 19-inch server specification capable of installing four standard 3.5-inch hard disk drives. The inventor of the present invention also filed the U.S. Patent Publication No. 2003-0147210A1 entitled "Server chassis with control panel" that can change the position of the control panel to expand the number of installable disks. However, the computation speed of a computer in actual practice is increasing day after day, and only 9~12 disks are no longer sufficient for the practical application. The method of maximizing the number of installable disk drives under the condition of unable to further expand the server while complying with the existing server specification demands immediate attention and improvement.

After a 2.5-inch hard disk drive of a smaller volume specification having the performance of a 3.5-inch hard disk drive of a larger volume specification is introduced, the foregoing problem is solved. For example, the traditional disk array 1' as shown in FIG. 1 can install 16 sets (4×4) of the 3.5-inch hard disk drives, but it can install 30 sets (6×5) of 2.5-inch hard disk drives in the same space as shown in FIG. 4. The new specification can greatly improve the storage capacity of the disk array 1'. However, it is found that if the circuit board 20' used for the traditional disk array 1' is adopted, then the number of connection ports 205' on the circuit board has to be increased accordingly because the number of hard disk drives 10' is increased. Therefore, there remains no more space on the circuit board 20' for the layout of the circuitry, and thus it is a major factor that the 2.5-inch hard disk cannot be used for the disk array 1' in the present industry.

SUMMARY OF THE INVENTION

The primary objective of the present invention is to overcome the foregoing shortcoming and avoid the exiting deficiency. The present invention abandons the single circuit board design, but it uses a circuit board group comprised of a primary circuit board and a secondary circuit board instead. The primary circuit board is divided into an electronic device connecting section and a circuit section; wherein the electronic device connecting section comprises a first connection port for installing electronic devices, and the circuit section comprises a second connection port, and the primary circuit board is electrically connected to a secondary circuit board. A third connection port coupled to the corresponding second connection port is disposed on the secondary circuit board at a position corresponding to the circuit section, and a through hole is disposed on the secondary circuit board at a position corresponding to the electronic device connecting section for allowing the first connection port to pass through, and a fourth connection port is disposed on another side of the secondary circuit board for coupling electronic devices. The foregoing arrangement increases the total number of installable electronic devices for the first connection port and the fourth connection port for connecting the circuitry of each electronic device onto the primary circuit board, and thus can solve the layout issue and effectively expanding the electronic devices.

Another objective of the present invention is to install the first connection port after the secondary circuit board is coupled with the primary circuit board such that the first connection port is parallel to the fourth connection port of the secondary circuit board. Therefore, the electronic device can be electrically connected to the fourth connection port and the first connection port at the same position of the interface.

A further objective of the present invention is to provide an electronic device array or a server that can be used in a disk array or a power supply array.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

To make it easier for our examiner to understand the objective of the invention, its structure, innovative features, and performance, we use a preferred embodiment and the attached drawings for the detailed description of the invention.

Figure 1:
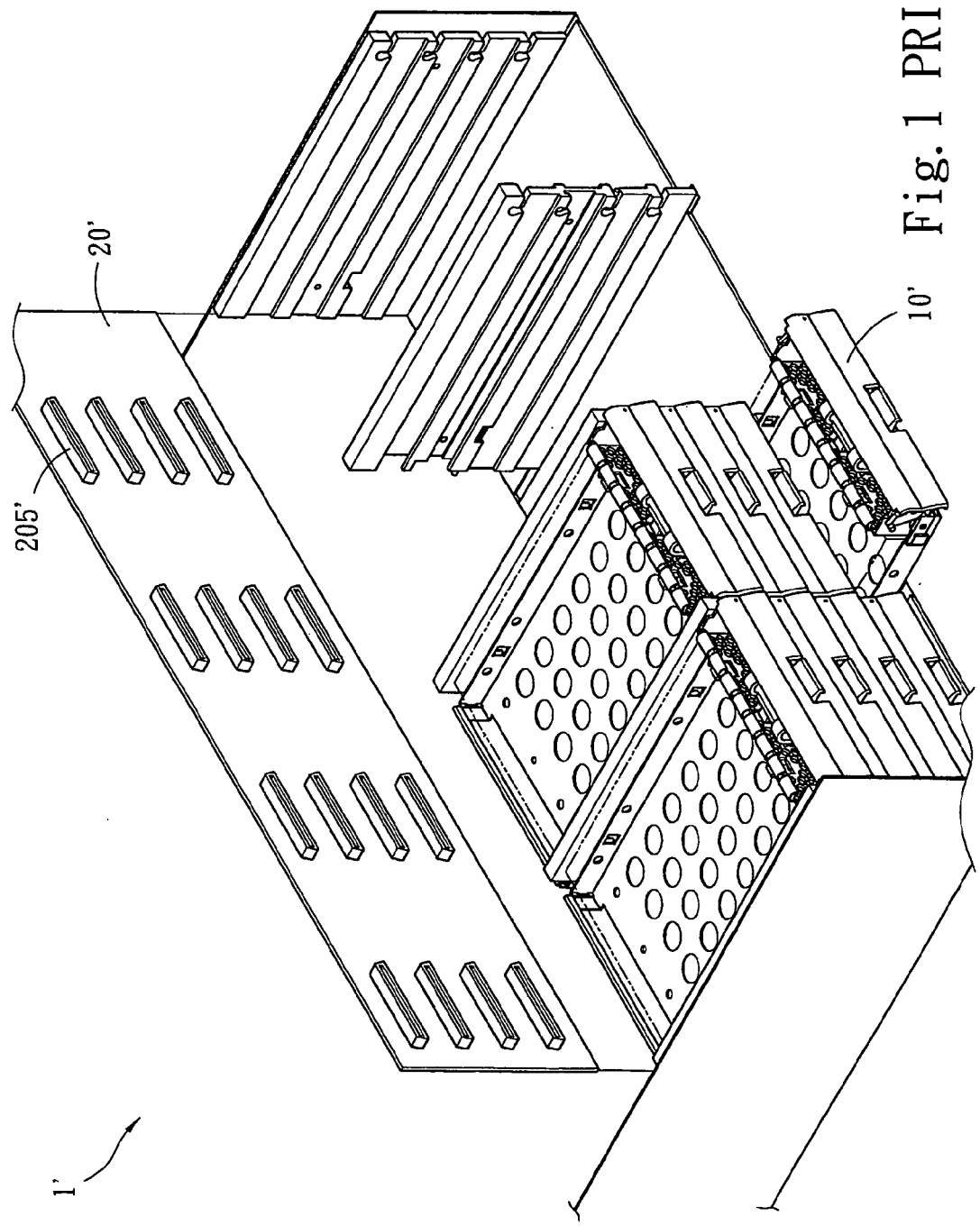
FIG. 1 is a perspective view of a prior-art disk array.
Figure 2:
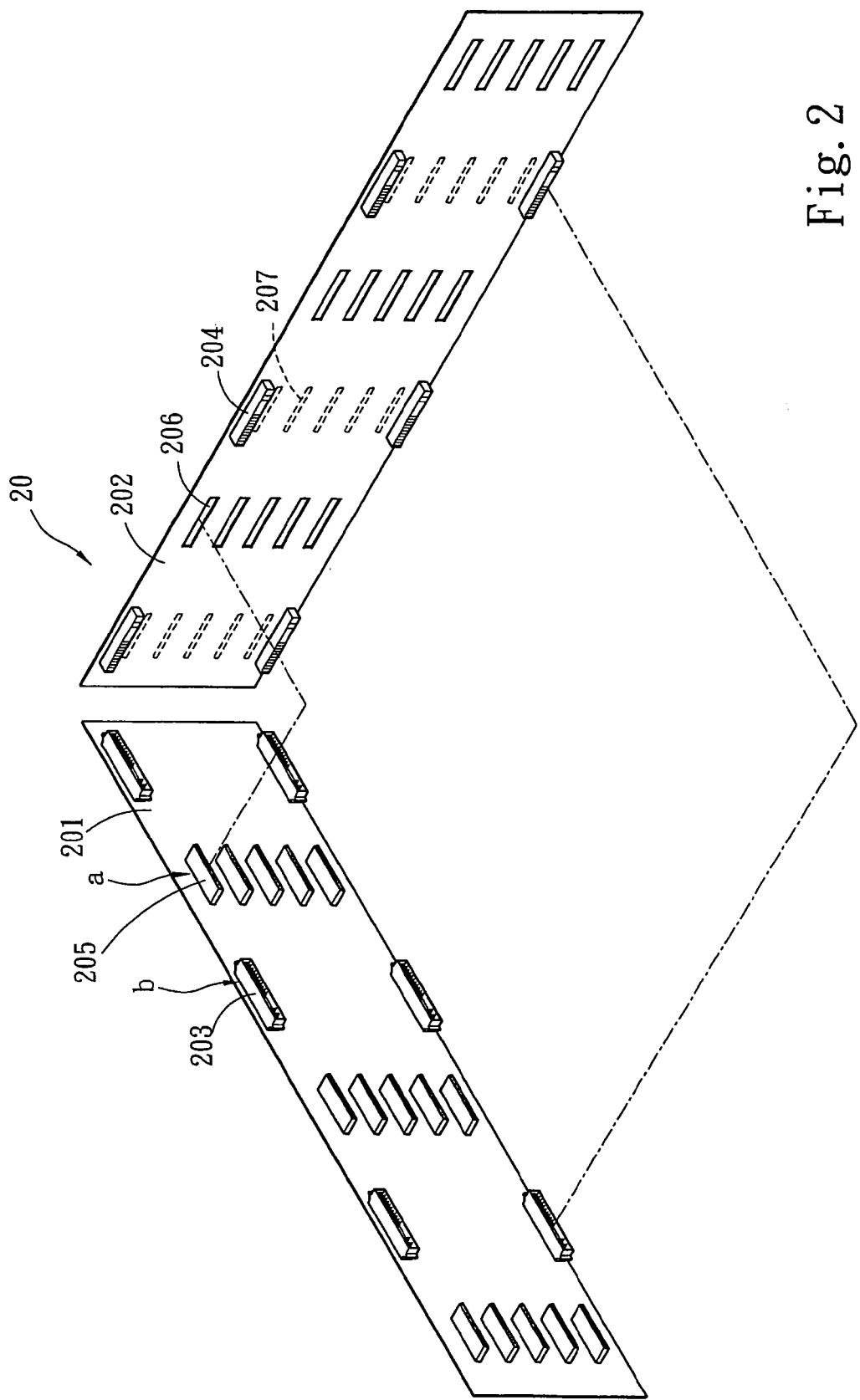
FIG. 2 is a perspective view of the disassembled structure of the present invention.
Figure 3:
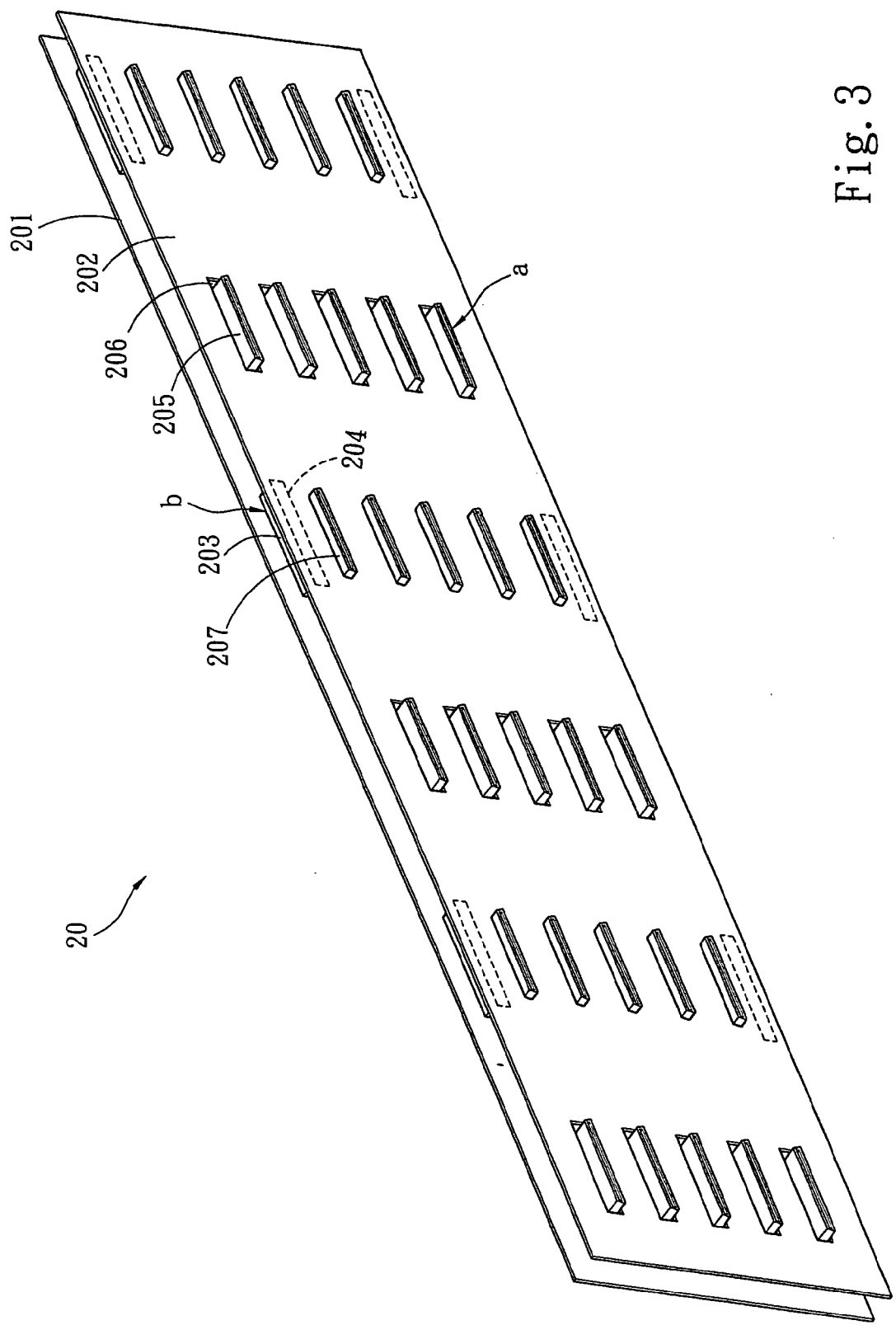
FIG. 3 is a perspective view of the assembled structure of the present invention.
Figure 4:
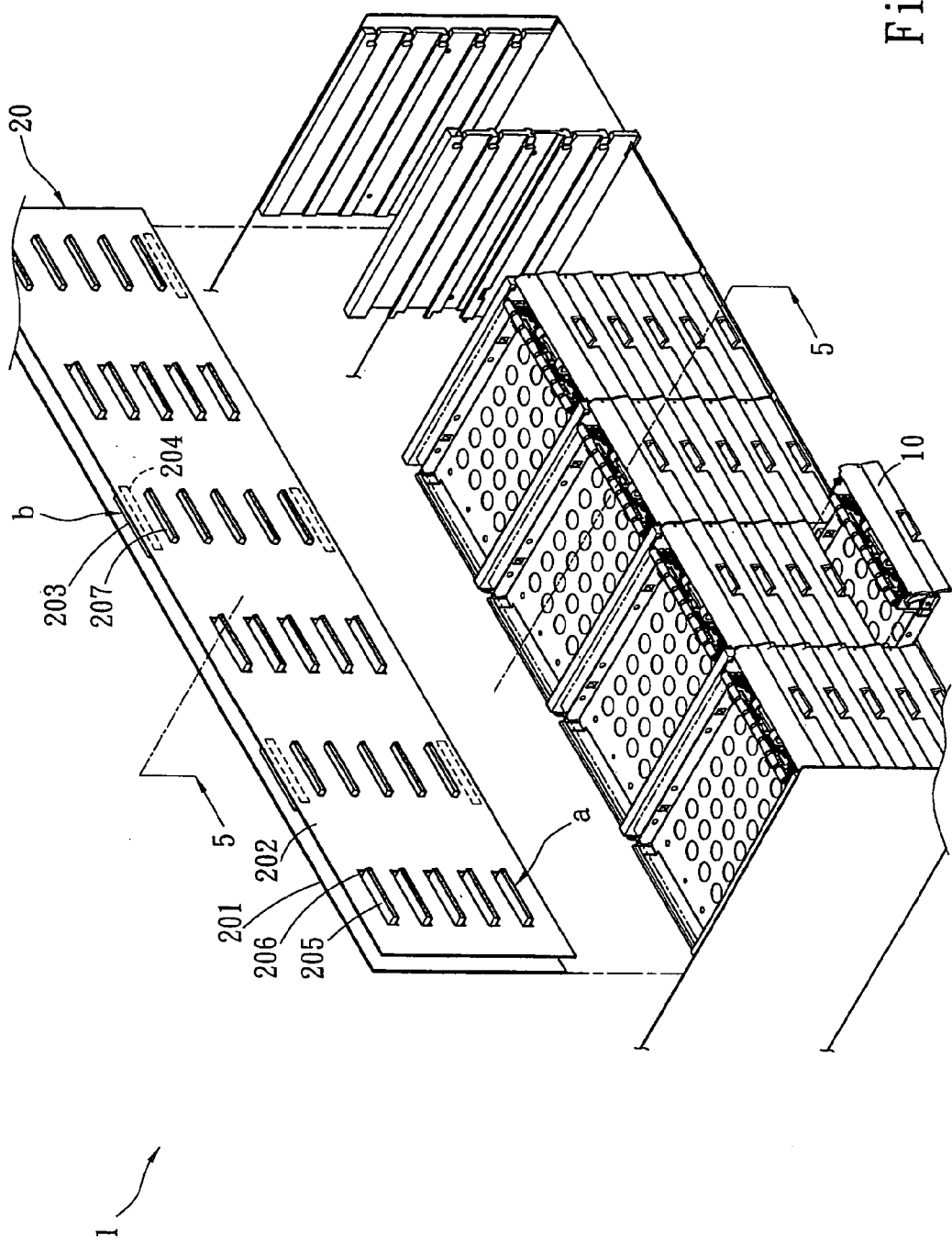
FIG. 4 is a perspective view of the installation of the disk array according to the present invention.

Please refer to FIGS. 2 to 3 for the perspective view of the disassembled structure, assembled structure and the installation of the present invention respectively. In the figures, the present invention relates to a circuit board group 20 for electrically coupled to a plurality of electronic devices 10 to define an electronic connection with the electronic devices 10. The foregoing electronic device 10 is a hard disk array 1 comprised of a plurality of hard disk drives or a power supply array comprised of a plurality of power supplies. The following embodiments adopt the 2.5-inch hard disk drive as the electronic device 10 installed to a disk array 1.

The circuit board group 20 according to the present invention comprises a primary circuit board 201 and the primary circuit board 201 is divided into an electronic device connecting section a and a circuit section b. The electronic connecting section a comprises a first connection port 205 for coupling electronic devices 10 and the circuit section b comprises main circuitry layout such as a circuit with logical operations for related processing functions and an electronic component such as an integrated circuit (IC) for related processing functions. The circuit section b comprises a second connection port 203 and the primary circuit board 201 is electrically coupled to a secondary circuit board 202. A third connection port 204 coupled to the second connection port 203 is disposed on the secondary circuit board 202 at a position corresponding to the circuit section b and a through hole 206 is disposed on the secondary circuit board 202 at a position corresponding to the electronic device connecting section a for passing the first connection port 205 through. Since the secondary circuit board 202 only has fewer circuits such as the power supply for certain processing functions, therefore the other side of the secondary circuit board 202 has a larger connecting section provided for the fourth connection port 207 to connect electronic devices 10, and thus can increase the number of installable electronic devices 10.

Figure 5:
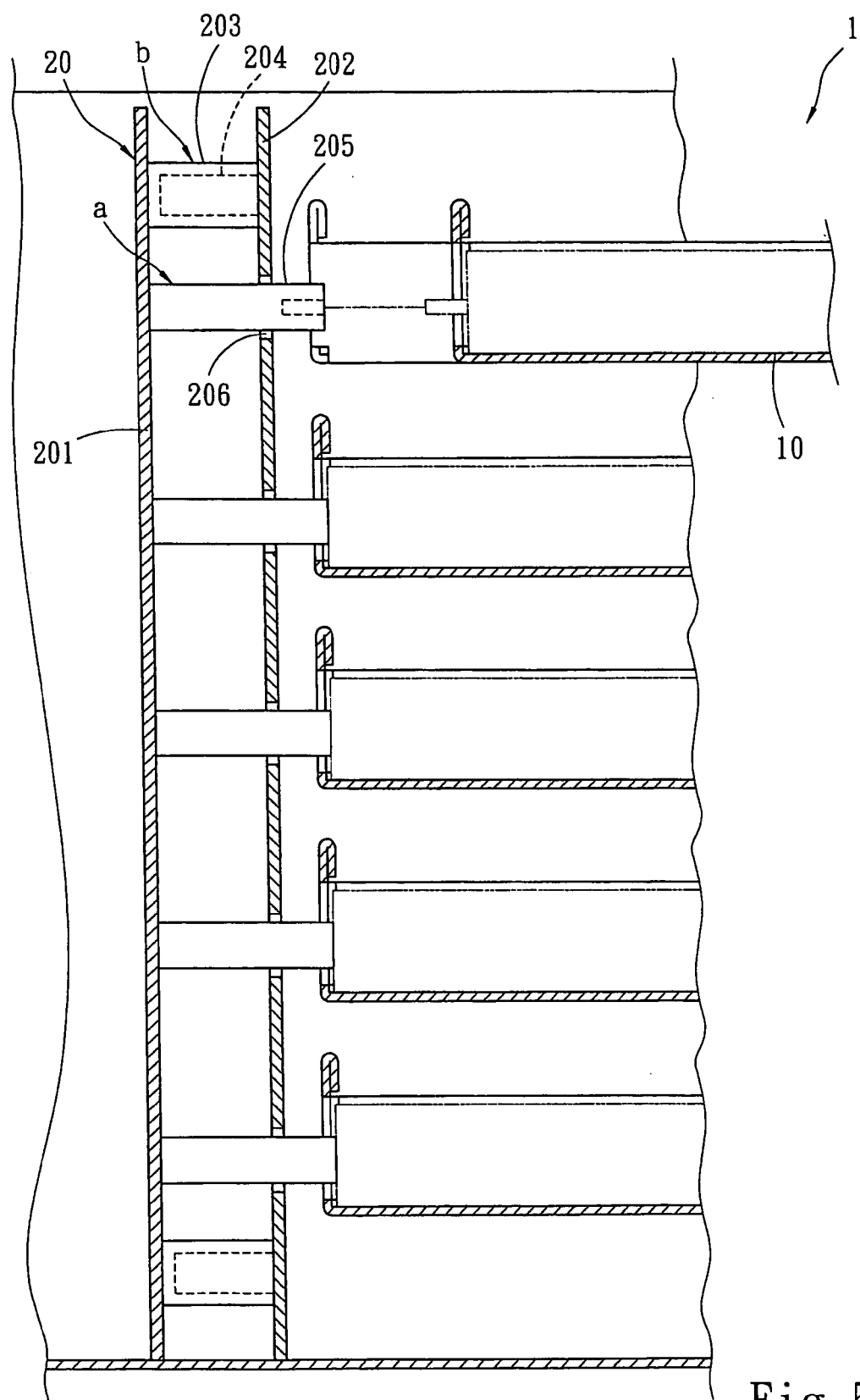
FIG. 5 is a cross-sectional view of Section 4—4 as depicted in FIG. 4.

Please also refer to FIG. 5. If a user connects the third connection port 204 with the second connection port 203 for the secondary circuit board 202, then the secondary circuit board 202 will be electrically connected with the second connection port 203, such that the first connection port will pass through the through hole 206 on the secondary circuit board 202; wherein the through hole 206 is designed either for a single first connection port 205 or for two or more first connection ports 205). Then, the first connection port 205 and the fourth connection port 207 will be aligned parallel to each other, such that the electronic devices 10 can be electrically connected to the fourth connection port 207 and the first connection port 205 at the position of the same interface.

From the description above, it is clear that the present invention can effectively expand the number of hard disk drives and drastically increases the storage capacity of the disk array 2. As to the circuit layout, the secondary circuit board 202 does not have extra space for the circuit layout and the installation of electronic components, but after the second connection port 203 and the third connection port 201 are connected, the second circuit board 202 will send electronic signals to the primary circuit board 201 for the processing. Therefore, the present invention can effectively solve the tough problems of the circuit layout for the traditional single circuit board, and maximize the performance of the electronic device having a small volume specification and greatly enhance the economic benefits for the industrial applications.

While the invention has been described by way of example and in terms of a preferred embodiment, it is to be understood that the invention is not limited thereto, To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit board group for electrically coupling electronic devices, defining an electric connection for a plurality of electronic devices after said plurality of electronic devices being coupled to said circuit board group, and said circuit board group comprising:
   a primary circuit board, being divided into an electronic device connecting section and a circuit section and having a first connection port disposed in said electronic device connecting section for coupling with said plurality of electronic devices and a second connection port disposed in said circuit section;
   a secondary circuit board, being electrically coupled to said primary circuit board and comprising a third connection port coupled to said second connection port being disposed on said secondary circuit board at a position corresponding to said circuit section, a through hole disposed on said secondary circuit board at a position corresponding to said electronic device connecting section, and a fourth connection port disposed on another side of said secondary circuit board for coupling with said electronic device, the first, second, third and fourth connection ports being on a same side of the primary and secondary circuit boards.

2. The circuit board group for electrically coupling electronic devices of claim 1, wherein said fourth connection port is parallel with said first connection port after said fourth connection port and said second circuit board are electrically coupled with said primary circuit board, thereby said electronic device is capable of being electrically coupled with said fourth connection port and said first connection port at the position of the same interface.

3. The circuit board group for electrically coupling electronic devices of claim 1, wherein said electronic device is a disk array comprised of a plurality of hard disk drives.

4. The circuit board group for electrically coupling electronic devices of claim 1, wherein said electronic device is a power supply array comprised of a plurality of power supplies.

5. The circuit board group for electrically coupling electronic devices of claim 1, wherein at least one of the first connection port and the second connection port extends through the through hole on the secondary circuit board.

\* \* \* \* \*